United States Patent [19]

Yoon

[11] Patent Number: 5,694,370
[45] Date of Patent: Dec. 2, 1997

[54] HIGH SPEED DATA ACCESS APPARATUS FOR PAGED MEMORY DEVICE

[75] Inventor: Yeon-Joong Yoon, Inchon, Rep. of Korea

[73] Assignee: LG Semicon Co., Ltd., Cheongju, Rep. of Korea

[21] Appl. No.: 770,167

[22] Filed: Dec. 19, 1996

[30] Foreign Application Priority Data

Dec. 20, 1995 [KR] Rep. of Korea ............... 52880/1995

[51] Int. Cl.$^6$ ............................................. H03K 19/00
[52] U.S. Cl. ............................. 365/233.5; 365/238.5; 365/189.05
[58] Field of Search .................. 365/233.5, 238.5, 365/189.05, 233

[56] References Cited

U.S. PATENT DOCUMENTS

| | | | |
|---|---|---|---|
| 5,305,284 | 4/1994 | Iwase | 365/238.5 |
| 5,345,421 | 9/1994 | Iwamura et al. | 365/233.5 |
| 5,479,374 | 12/1995 | Kobayashi et al. | 365/233.5 |
| 5,563,835 | 10/1996 | Oldham | 365/189.05 |

Primary Examiner—David C. Nelms
Assistant Examiner—Vu A. Le
Attorney, Agent, or Firm—Fleshner & Kim

[57] ABSTRACT

A high speed data access apparatus for memory allows only a first page data to perform normal mode access during initial operation, by means of latch control signal generation using a page address signal, and the accompanying page data to practice a page mode access. The apparatus realizes a high speed data access.

4 Claims, 7 Drawing Sheets

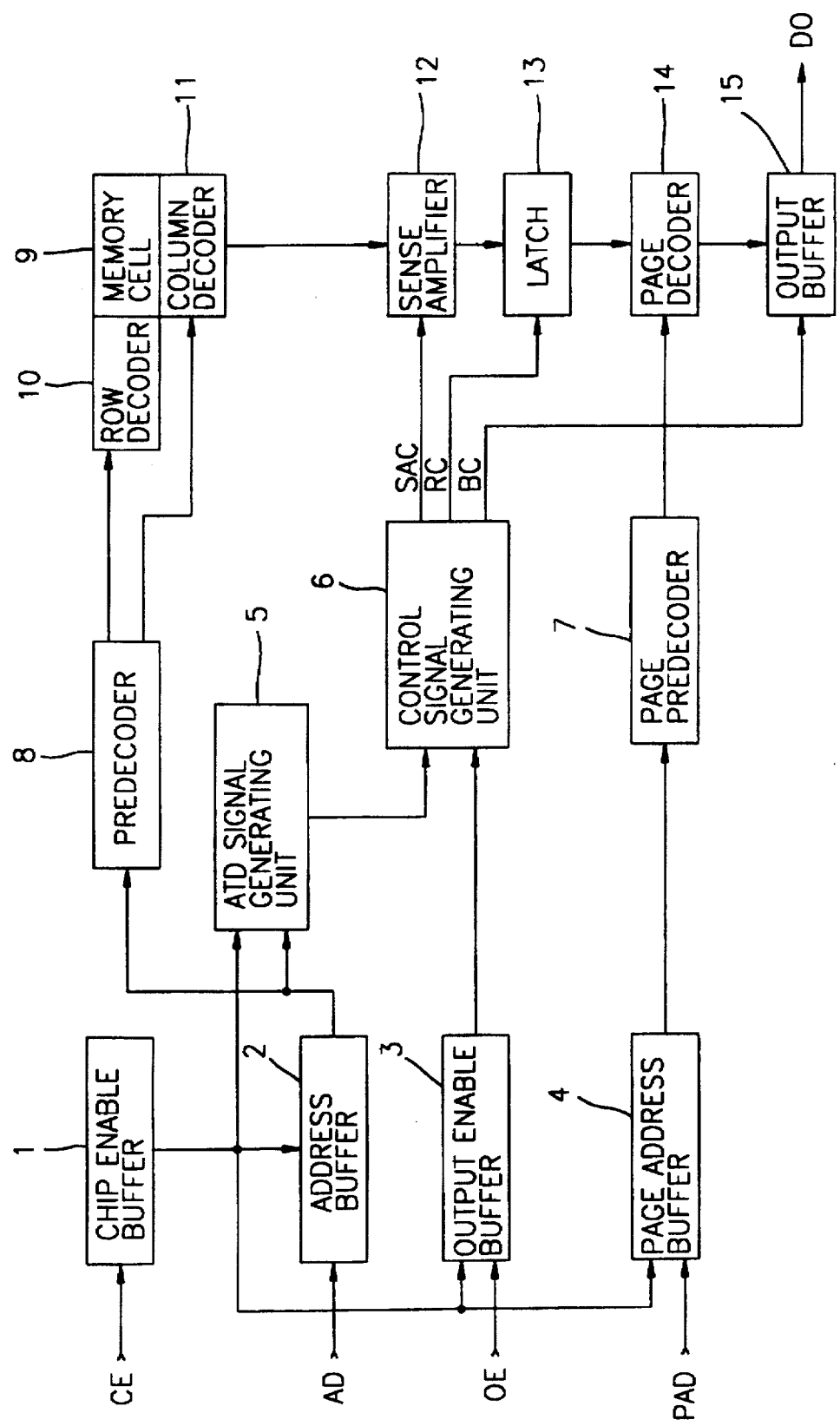

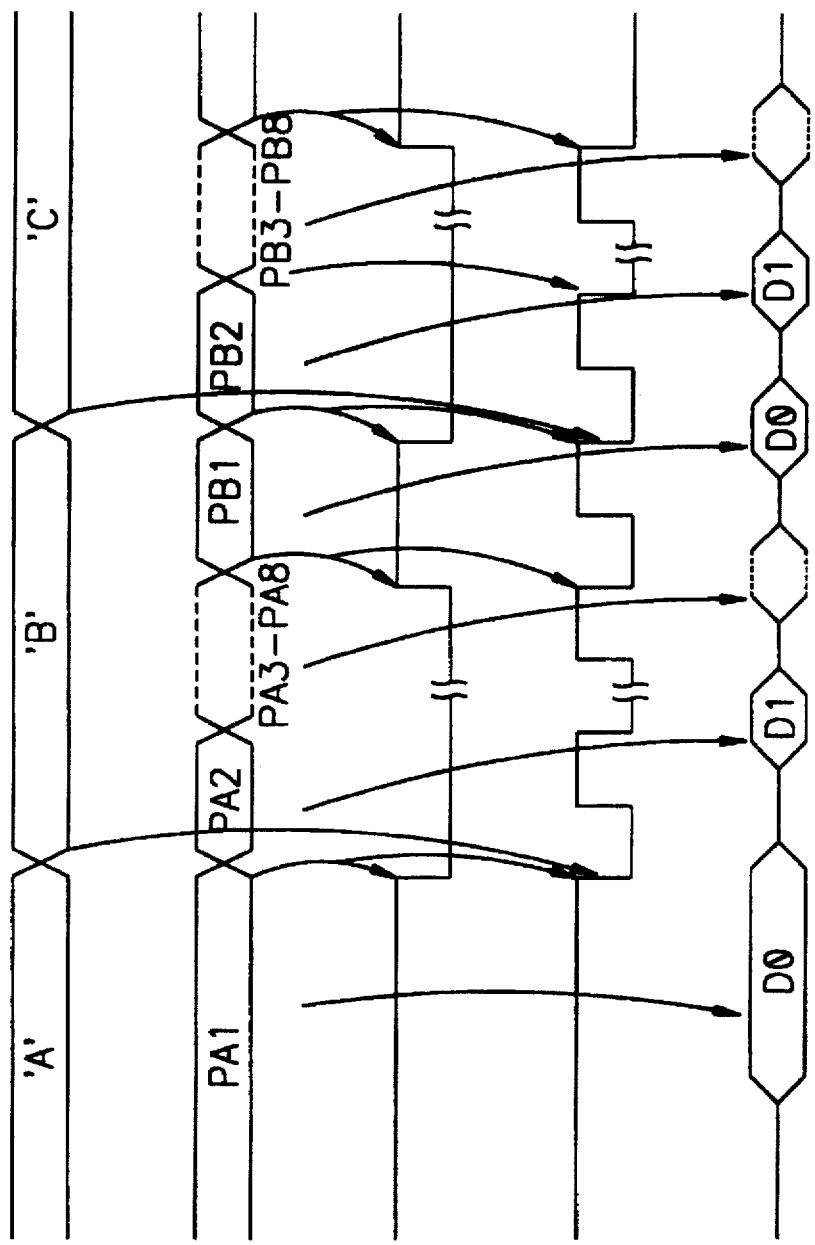

5,694,370

HIGH SPEED DATA ACCESS APPARATUS FOR PAGED MEMORY DEVICE

BACKGROUND OF THE INVENTION

1. Field of the Invention

The present invention relates to a data access apparatus, and more particularly to a high speed data access apparatus for a semiconductor memory device for accessing data under a normal mode access time using a first page address signal being received during an initial operation by controlling a latch in accordance with a latch signal generation caused by the page address signal, and accessing data in a page mode access time for subsequently occurring page address signals so as to realize a high speed data access.

2. Description of the Conventional Art

As shown in FIG. 1, a conventional memory data access apparatus includes a chip enable buffer 1 for buffering an externally applied chip enable signal CE, an address buffer 2 for buffering an externally applied address signal AD after being enabled by the buffered chip enable signal outputted from the chip enable buffer 1, an output enable buffer 3 for buffering an externally applied output enable signal OE after being enabled by the buffered chip enable signal outputted from the chip enable buffer 1, a page address buffer 4 for buffering an externally applied page address signal PAD by the chip enable signal applied thereto from the chip enable buffer 1, an address transition detection (hereinafter, "ATD") signal generator 5 for detecting the transition of the address signal outputted from the address buffer 2 after being enabled by the chip enable signal outputted from the chip enable buffer 1 and generating an ATD signal in accordance with the transition detection, a control signal generator 6 for generating a sense amplifier control signal SAC, a latch control signal RC and an output buffer control signal BC respectively after being enabled by the output enable signal outputted from the output enable buffer 3 in accordance with the ATD signal outputted from the ATD signal generator 5, a page pre-decoder 7 for pre-decoding the page address signal outputted from the page address buffer 4, an address pre-decoder 8 for pre-decoding the address signal outputted from the address buffer 2, a decoder 10 for decoding a row address signal outputted from the address pre-decoder 8 and selecting a bit line (not shown) in a memory cell 9, a column decoder 11 for decoding a column address signal outputted from the address pre-decoder 8, selecting a word line (not shown) and reading a data signal stored in the memory cell 9 via the bit line selected by the row decoder 10, a sense amplifier 12 for amplifying the data read by the row decoder 10 and the column decoder 11 to a certain level after being enabled by the sense amplifier control signal SAC outputted from the control signal generator 6, a latch 13 for storing temporarily the data signal outputted from the sense amplifier 12 after being enabled by the latch control signal RC outputted from the control signal generator 6, a page decoder 14 for decoding a page signal outputted from the page pre-decoder 7 and selectively outputting therefrom the data outputted from the latch 13, and an output buffer 15 for buffering the data outputted from the page decoder 14 after being enabled by the buffer control signal BC outputted from the control signal generator 6 and outputting therefrom, the buffered data signal DO.

As shown in FIG. 3, another conventional memory data access apparatus comprises an address buffer 20 for buffering an externally applied address signal ADS, a page address buffer 21 for buffering an externally applied page address signal PADS, an ATD signal generator 22 for detecting the transition of the address signal ADS outputted from the address buffer 20 and generating an ATD signal in accordance with the transition detection, a page pre-decoder 23 for pre-decoding the page address signal PADS outputted from the page address buffer 21, a pre-decoder 24 for pre-decoding the address signal outputted from the address buffer 20, a row decoder 26 for decoding a row address signal outputted from the pre-decoder 24 and selecting a bit line in a memory cell 25, a column decoder 27 for decoding a column address signal outputted from the pre-decoder 24, selecting a word line and reading a data signal stored in the memory cell 25 via the bit line selected by the row decoder 26, a sense amplifier 28 for amplifying the read data signal to a certain level, a latch 29 for storing temporarily the data signal outputted from the sense amplifier 28 after being enabled by the ATD signal outputted from the ATD signal generator 22, a page decoder for selectively outputting the data signal outputted from the latch 29 by means of decoding a signal outputted from the page pre-decoder 23, and an output buffer 31 for buffering the data signal outputted from the page decoder 30 and outputting therefrom the buffered data signal DOUT.

FIG. 2 and FIG. 4 illustrate in detail the operation in accordance with the conventional memory device data access apparatus as described above with reference to FIG. 1 and FIG. 3.

First, the conventional data access apparatus operations for a memory device in accordance with FIG. 1 are as follows.

When the chip enable buffer 1 buffers and outputs therefrom an externally applied chip enable signal CE in a first page mode cycle, the address buffer 2 is enabled by the chip enable signal CE outputted from the chip enable buffer 1 and buffers and outputs an externally applied address signal 'A' as shown in FIG. 2A. The output enable buffer 3 is enabled by the chip enable signal CE outputted from the chip enable buffer 1 and buffers and outputs therefrom an externally applied output enable signal OE.

The page address buffer 4 is enabled by the chip enable signal CE outputted from the chip enable buffer 1 and buffers and outputs an externally applied first page address signal PA1 as shown in FIG. 2B. The ATD signal generator 5, enabled by the chip enable signal CE outputted from the chip enable buffer 1, receives the address signal outputted from the address buffer 2, detects a transition of the address signal transmitted from address buffer 2, and outputs an ATD signal in accordance with the detection.

The control signal generator 6, enabled by the output enable signal outputted from the output enable signal buffer 3, receives the ATD signal outputted from the ATD signal generator 5, and generates in accordance with the received ATD signal a high level latch signal RC as shown in FIG. 2C, a sense amplifier control signal SAC and a buffer control signal BC.

The page pre-decoder 7 receives the page address signal from the page address buffer 4, pre-decodes it and outputs a first page address signal PA1. The pre-decoder 8 receives the address signal outputted from the address buffer 2, pre-decodes it and outputs the pre-decoded address signal.

The row decoder 10 decodes the signal applied thereto from the pre-decoder 8, and selects a bit line in the memory cell 9. The column decoder 11 receives and decodes the signal outputted from the pre-decoder 8 and selects a word line in the memory cell 9. Accordingly, an 8-bit data which is stored in the memory cell 9 by a word line which is enabled by the column decoder 11 is outputted therefrom in parallel via bit lines enabled by the row decoder 10.

The sense amplifier 12 amplifies and outputs the 8-bit data inputted from the column decoder 11 after being-enabled by the sense amplifier control signal SAC inputted from the control signal generator 6, then the latch 13 stores temporarily and outputs therefrom the 8-bit data inputted from the sense amplifier 12 in accordance with a high level latch control signal RC inputted from the control signal generator 6.

The page decoder 14 decodes the signal applied thereto from the page pre-decoder 7, and outputs a first page data inputted from the latch 13 in accordance with the decoded signal.

The output buffer 15, enabled by the buffer control signal BC outputted from the control signal generator 6, buffers the first page data outputted from the page decoder 14, and outputs externally the buffered data DO as shown in FIG. 2D. When an externally applied second page address signal PA2 as shown in FIG. 2B is buffered and output from the page address buffer 4, the page pre-decoder 7 pre-decodes and outputs the second page address signal buffered by the page address buffer 4.

At this time, the ATD signal generator 5 continues to receive from the address buffer 2 the buffered address signal 'A', thus not detecting any address transition, and as a result, the ATD signal generator 5 outputs a signal reversed from a signal outputted when detecting the address-transition.

The control signal generator 6 receives the signal outputted from the ATD signal generator 5 and accordingly generates a low level latch control signal RC as shown in FIG. 2C, a sense amplifier control signal SAC and a buffer control signal BC, respectively.

The latch 13 continues to output a second through an eight page data designated by the address signal 'A' in accordance with a low level latch signal RC outputted from the control signal generator 6.

The page decoder 14 decodes the signal pre-decoded from the second page address signal outputted from the page pre-decodes 7 and outputs a second page data applied thereto from the latch 13.

The page decoder 14 sequentially outputs a third through an eighth page data inputted from the latch 13 in accordance with a third page address signal PA3 through an eighth page address signal PA8 as shown in FIG. 2B.

The output buffer 15 buffers the third through an eighth page data outputted from the page decoder 14 in accordance with a buffer control signal BC outputted from the control signal generator 6 and sequentially outputs the buffered data D2–D7.

In a second page mode cycle, when an address signal 'B' appearing in FIG. 2A is applied to the address buffer 2, and a first page address signal PB1 shown in FIG. 2B is applied to the page address buffer 4, the eight page data D0 to D7 are outputted under the same operation as previously described therefrom via the output buffer 15 as shown in FIG. 2D.

Conclusively, the access time of a first data among the eight data outputted from the output buffer 15 indicates a normal mode access time in which the data is withdrawn from the memory cell 9 is withdrawn and outputted via the sense amplifier 12, and the access time of the second to eighth data denotes a page mode access time except for the operating time of the sense amplifier 12.

with reference to FIGS. 4A through 4D, the operations of the conventional data access apparatus for a memory device as shown in FIG. 3 will be described.

When the buffered address signal 'A' as shown in FIG. 4A is output via the address buffer 20 at an initial stage of a first page mode cycle, and a buffered page address signal PA as shown in FIG. 4 is output via the page address buffer 21, the ATD signal generator 22 receives the buffered address signal from the address buffer 20 and detects the transition of the applied address signal.

At this time, since there occurred no transition in the address signal outputted from the address buffer 20, the ATD signal generator 22 outputs a low level ATD signal as shown in FIG. 4C.

The page pre-decoder 23 pre-decodes the page address signal outputted from the page address buffer 21.

The pre-decoder 24 pre-decodes the address signal outputted from the address buffer 20, and the row decoder 26 and the column decoder 27 each decode a signal outputted from the pre-decoder 24, thus reading out in parallel with each other eight page data stored in the memory cell 25.

The eight data outputted in parallel with each other in accordance with the row decoder 26 and the column decoder 27 are amplified and outputted via the sense amplifier 28.

The latch 29 is disabled by the low level ATD signal outputted from the ATD signal generator 22, thus blocking the eight data outputted from the sense amplifier 28.

The page decoder 30 decodes the signal inputted from the page pre-decoder 23, and outputs a data selected from the eight page data applied thereto from the latch 29. The data outputted from the page decoder 30 is buffered in the output buffer 31 and outputted therefrom as output data D0.

Each address signal buffered in the address buffer 20 is pre-decoded in the pre-decoder 24 and applied to the row decodes 26 and the column decoder 27.

The row decodes 26 and the column decoder 27 decode the signals outputted from the pre-decoder 24 and read out in parallel with each other the eight page data stored in the memory cell 25.

The eight page data read out by the row decoder 26 and the column decoder 27 are outputted therefrom through the sense amplifies 28 at a certain level.

As shown in FIG. 4C, the latch 29 is disabled by the low level ATD signal outputted from the ATD signal generator 22, and then blocks the eight page data outputted from the sense amplifier 28.

As shown in FIG. 4B, a page address signal PB2 is buffered in the page address buffer 21, and the page pre-decoder 23 pre-decodes a second page address signal outputted from the page address buffer 21. At this time, since the ATD signal generator 22 continues to receive from the address buffer 20 the buffered address signals 'B', as shown in FIG. 4C, the ATD signal generator 22 successively transmits a low level ATD signal.

The latch 29 is disabled by a low level ATD signal outputted from the ATD signal generator 22 and continues to output the second to eighth data.

The page decoder 30 decodes the signal outputted from the page predecoder 23 and outputs a second page data among the second to the eighth page data outputted from the latch 29.

The output buffer 31 buffers the second data outputted from the page decoder 30, and as shown in FIG. 4D, outputs a buffered second page data D1.

As shown in FIG. 4B, when the third to the eighth page addresses PB3–PB8 are externally and sequentially applied to the page address buffer 21, the page address buffer 21, the page predecoder 23 and the page decoder 30 begin operating as previously described, so that the third to eighth page data D2–D7 as shown in FIG. 4D can be outputted via the output buffer 31.

When an address signal 'C' as shown in FIG. 4A is buffered in the address buffer 20, the ATD signal generator 22 receives the address signal outputted from the address buffer 22, detects the transition from the address signal 'B', and accordingly outputs therefrom a high level ATD signal, as shown in FIG. 4C.

The latch 29 stores temporarily and outputs therefrom the eight page data designated by the address signal 'B' outputted from the sense amplifier 28 in accordance with the high level ATD signal outputted from the ATD signal generator 22.

The page decoder 30 decodes the signal outputted from the predecoder 23 and outputs sequentially the eight page data inputted from the latch 29.

The output buffer 31 sequentially buffets the eight page data transmitted from the page decoder 30 and, as shown is FIG. 4D, sequentially outputs the eight page data D0–D7.

When the address signals 'D', 'E' as shown in FIG. 4A, and the page address signals PD1–PD8, PE1–PE8 as shown in FIG. 4B, are sequentially inputted, the data access operation is repeated according to the previously described steps.

In conclusion, the page data access time designated by an address signal preferentially applied during the initial operation denotes a normal mode access time; the page data access time designated by the rest of the address signal becomes a page mode access time.

However, as shown in the hatched part of FIG. 2D, the conventional memory data access apparatus has a page data access time delay problem, since the page data output cannot be effected during the time between the address signal transition and the beginning of data output.

In addition, as shown in the hatched part of FIG. 4D, the other conventional memory data access apparatus also has a data access time delay because the data output does not occur until after the page data output at an initial level.

SUMMARY OF THE INVENTION

Accordingly, it is an object of the present invention to provide a high speed memory data access apparatus capable of accessing a first page data at a normal mode access time and the rest of the page data at a page mode access time respectively during the initial operation, by means of controlling the latch via a latch control signal in accordance with a page address signal.

It is another object of the present invention to provide a high speed memory data access apparatus for preventing noise from being generated during an output buffer operation, by controlling the output buffer during a page mode as well as during a normal mode.

To achieve the above-described objects, the high speed memory data access apparatus according to the invention comprises an ATD signal generator for detecting each transition of an address signal and a page address signal after being enabled by a chip enable signal and for generating an address transition signal and a page ATD signal, a first control signal generator for generating a sense amplifier enable signal based on the ATD signal outputted from the ATD signal generator after being enabled by an enable signal inputted thereto from an output enable buffer and generating a buffer control signal based on the ATD signal and the page address transition signal respectively outputted from the ATD signal generator, a second control signal generator for generating a latch control signal based on the page address signal, a page pre-decoder for pre-decoding the page address signal, a pre-decoder for decoding an address signal, a row decoder for decoding a signal outputted from the predecoder and selecting a bit line of a memory cell, a column decoder for decoding a signal outputted from the predecoder, selecting a word line from the memory cell and withdrawing a page data via the bit line selected by the row decoder, a sense amplifier for, after being enabled by the sense amplifier enable signal outputted from the first control signal generator, amplifying the page data applied thereto by the row decoder and the column decoder, a latch for temporarily storing therein data outputted from the sense amplifier after being enabled by a latch signal outputted from the second control signal generator, a page decoder for decoding a signal outputted from the page predecoder and selectively outputting therefrom the page data outputted from the latch, and an output buffer for buffering the page data outputted from the page decoder after being enabled by a buffer control signal outputted from the first control signal generator and for outputting the buffered page data therefrom.

BRIEF DESCRIPTION OF THE DRAWINGS

FIG. 1 is a block diagram showing a conventional data access apparatus for a memory device;

FIGS. 8A through 8E are operation timing views of the apparatus of FIG. 5.

DETAILED DESCRIPTION OF THE INVENTION

Figures 2A, 2B, 2C, 2D:
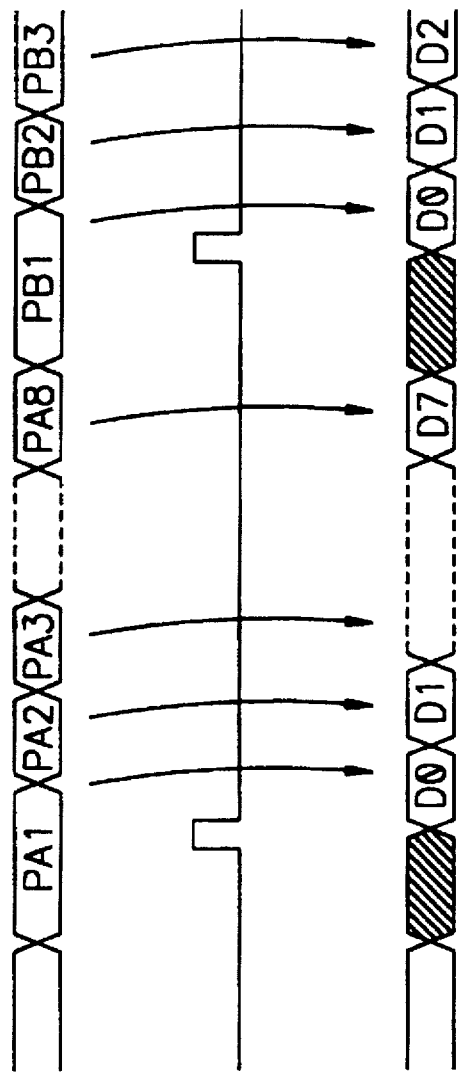
FIGS. 2A through 2D are operation timing views of the apparatus of FIG. 1.
Figure 3:
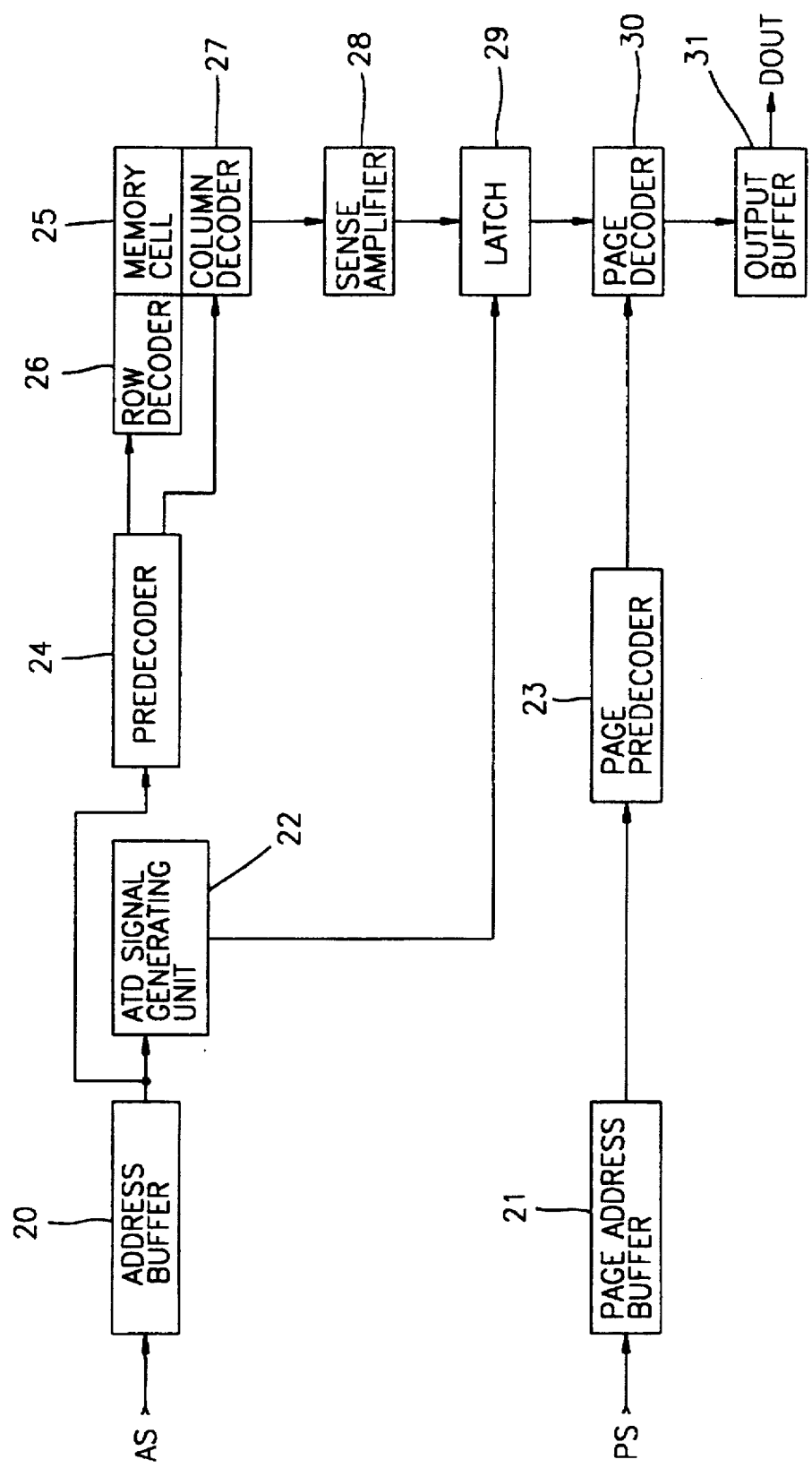
FIG. 3 is a block diagram showing another conventional data access apparatus for a memory device.
Figures 4A, 4B, 4C, 4D:
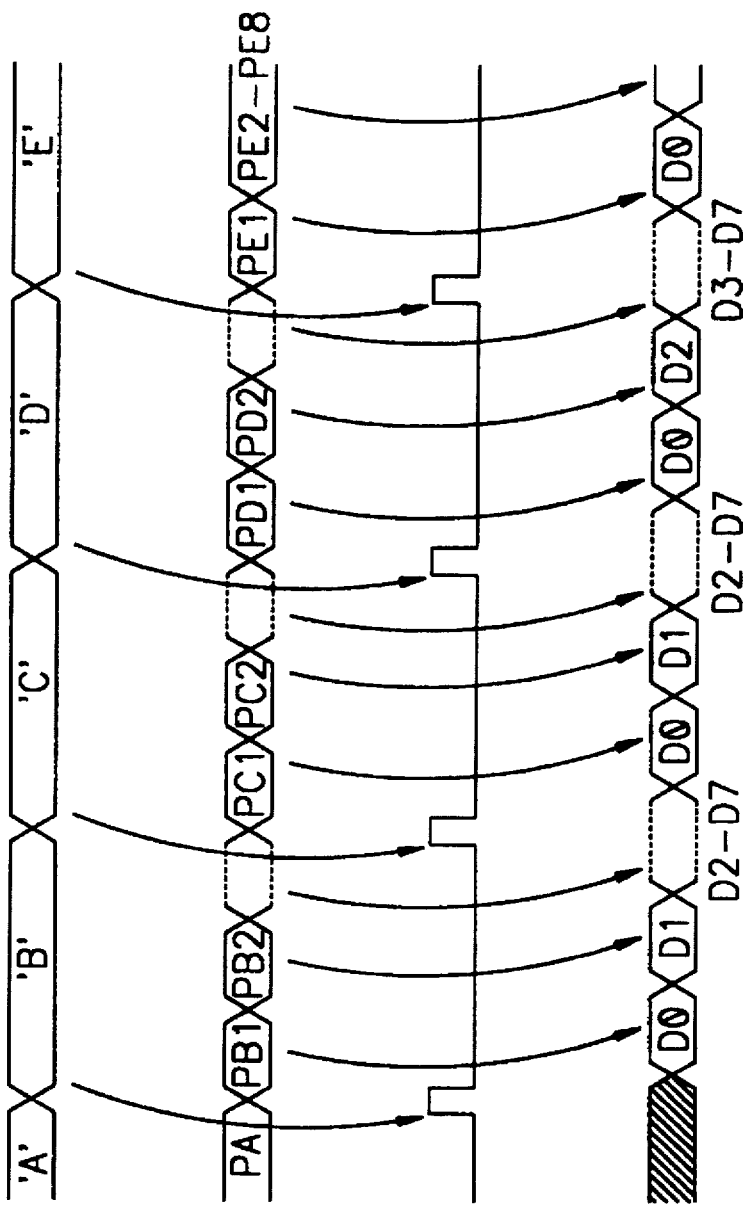
FIGS. 4A through 4D are operation timing views of the apparatus of FIG. 3.
Figure 5:
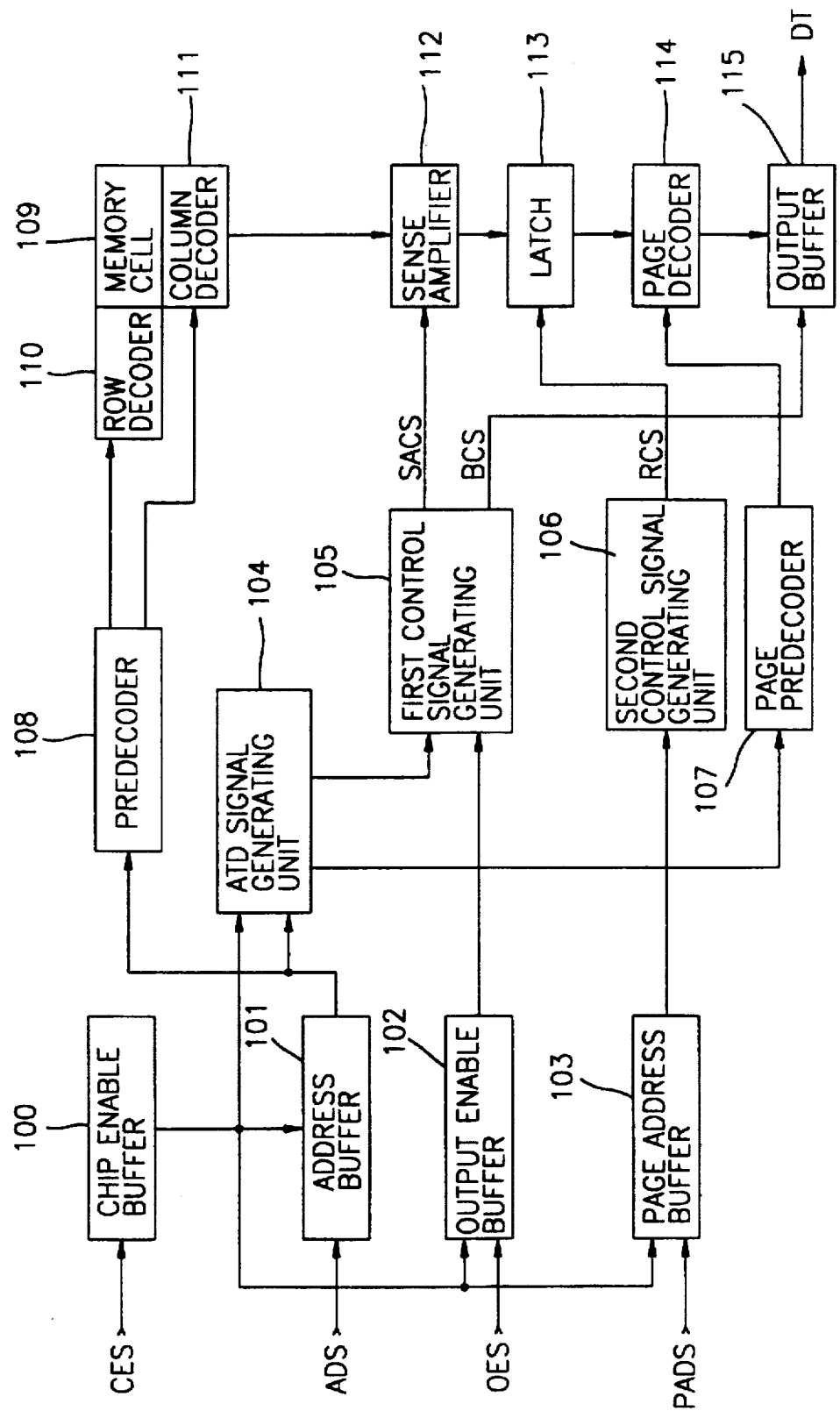
FIG. 5 is a block diagram a high speed data access apparatus for a memory device in accordance with the present invention.

As shown in FIG. 5, the high speed data access apparatus for a semiconductor memory chip according to the present invention includes a chip enable buffer 100 for buffering an externally applied chip enable signal CES, an address buffer 101 for buffering an externally applied address signal ADS in response to the chip enable signal CES, an output enable buffer 102 for buffering an externally applied output enable signal OES when enabled by the chip enable signal CES outputted from the chip enable buffer 100, a page address buffer 103 for buffering an externally applied page address signal PADS when enabled by the chip enable signal CES outputted from the chip enable buffer 100, an ATD signal generator 104 for detecting each transition of the address signal and the page address signal after being enabled by the chip enable signal and for generating an ATD signal ATDS and a page ATD signal PATDS in accordance wherewith, a first control signal generator 105 for generating a sense amplifier control signal SACS in response to the ATD signal ATDS outputted from the ATD signal generator when enabled by the output enable signal OES inputted thereto from the output enable buffer 105, and generating a buffer control signal BCS in response to the ATD signal ATDS and the page ATD signal PATDS respectively outputted from the ATD signal generator 104, a second control signal generator 106 for generating a latch control signal RCS in response to the page address signal PADS outputted from the page address buffer 103, a page predecoder 107 for predecoding the page address signal PADS outputted from the page address buffer 103, a predecoder 108 for decoding the address signal ADS outputted from the address buffer 101, a row decoder 110 for decoding a signal outputted from the predecoder 108 and selecting a bit line of a memory cell 109, a column decoder 111 for decoding a signal outputted from the predecoder 108, selecting a word line from the memory cell 109 and reading a page data via the bit line selected by the row decoder 110, a sense amplifier 112 for, when enabled by the sense amplifier enable signal SACS outputted from the first control signal generator 105, amplifying to a certain level the page data applied thereto by the row decodes 110 and the column decoder 111, a latch 113 for temporarily storing therein the data outputted from the sense amplifies 112 when enabled by the latch signal RSC outputted from the second control signal generator 106, a page decoder 114 for decoding a signal outputted from the page predecoder 107 and selectively outputting the page data from the latch 113, and an output buffer 115 for buffering the page data outputted from the page decodes 114 when enabled by the buffer control signal BCS from the first control signal generator 105 and outputting the buffered page data DT therefrom.

Figure 6:
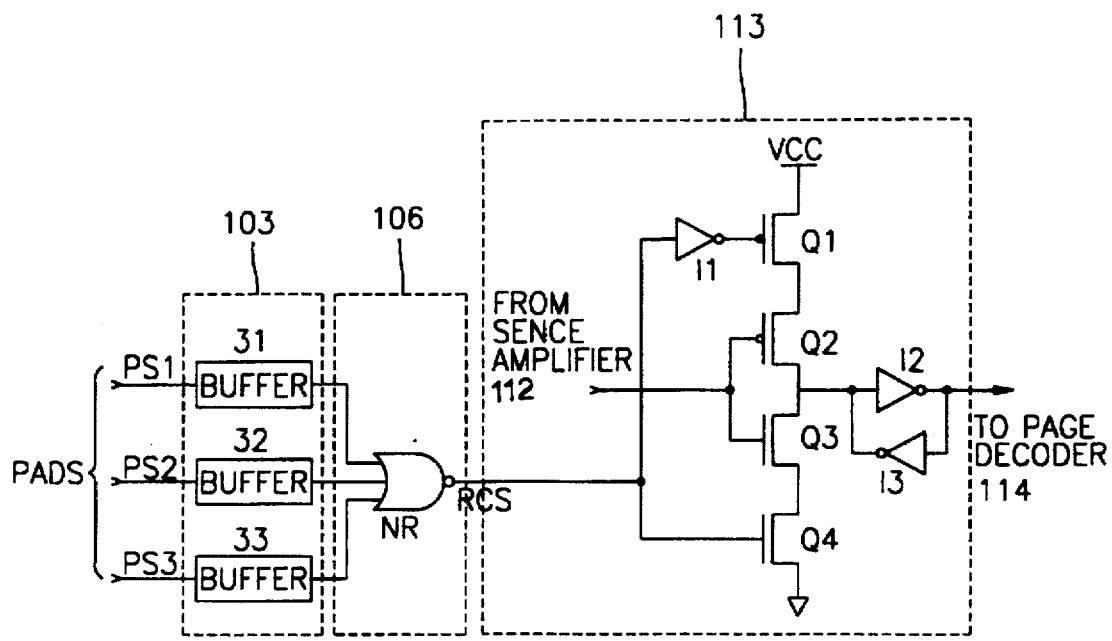
FIG. 6 is a partial detailed circuit view of FIG. 5.

As shown in FIG. 6, the page address buffer 103 includes buffers 31, 32 and 33, which buffer externally applied page address signals PS1, PS2 and PS3, respectively.

The second control signal generator 106 includes a NOR gate NR for NORring the page address signals outputted from the buffers 31, 32 and 33, and outputting a latch control signal RCS in accordance with the NORed result.

The latch 113 includes an inverter I1 having its input terminal connected to the output terminal of the NOR gate NR of the second control signal generator 106, a PMOS transistor Q1 having its source terminal connected to a supply voltage terminal VCC and its gate connected to the output terminal of the inverter I1, another PMOS transistor Q2 having its source terminal connected to the drain terminal of the PMOS transistor Q1 and its gate connected to the output line of the sense amplifier 112, an NMOS transistor Q3 having its drain terminal connected to that of the PMOS transistor Q2 and to the input terminal of an inverter I2 and its gate connected to that of the PMOS transistor Q2, another NMOS Q4 transistor having its drain terminal connected to the source terminal of the NMOS transistor Q3, its gate connected to the input terminal of the inverter I1 and its source terminal connected to ground, and an inverter I3 having its input terminal connected to the output terminal of the inverter I2 and its output terminal connected to the input terminal of the inverter I2.

Figure 7:
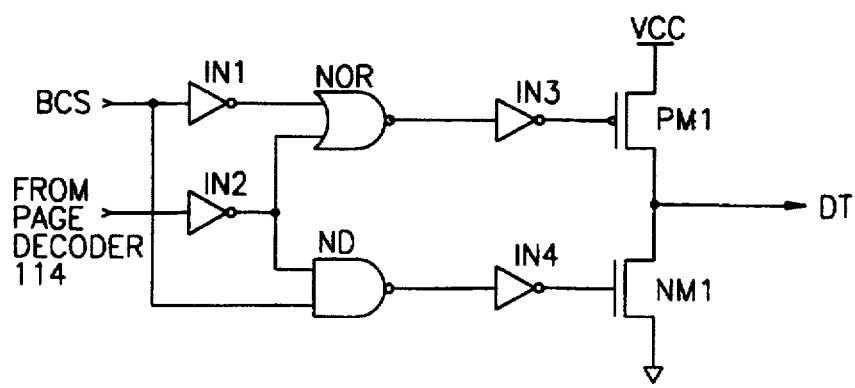
FIG. 7 is a detailed circuit showing an output buffer of FIG. 5.

As shown in FIG. 7, the output buffer 115 includes an inverter IN1 having its input terminal connected to receive the buffer control signal BCS outputted from the first control signal generator 105, an inverter IN2 having its input terminal connected to an output line from the page decoder 114, a NOR gate NOR having one input terminal thereof connected to the output of the inverter IN1 and another input thereof connected to the output of the inverter IN2, a NAND gate ND having one input thereof connected to the input of inverter IN1 and having another input thereof connected to the output of the inverter IN2, an inverter IN3 having its input connected to the output of the NOR gate NOR, an inverter IN4 having its input connected to the output of the NAND gate ND, a PMOS transistor PM1 having its source terminal connected to the supply voltage VCC and its gate connected to the output of the inverter IN3, and an NMOS transistor NM1 having its drain commonly connected to that of the PMOS transistor PM1, its gate connected to the output of the inverter IN4 and its source connected to ground.

With reference to FIG. 8, the operation of the thusly composed high speed data access apparatus for a semiconductor memory chip will be described as follows.

First, at an initial stage of the first page mode cycle the chip enable buffer 100 buffers and outputs an externally applied chip enable signal CES, and when enabled by the chip enable signal CES outputted from the chip enable buffer 100, the address buffer 101 buffers and outputs an address signal 'A' of FIG. 8A. The output enable buffer 102 buffers and outputs an externally applied output enable signal OES after being enabled by the chip enable signal CES outputted from the chip enable buffer 100.

Each of the buffers 31, 32 and 33 in the page address buffer 103 is enabled by the chip enable signal. CES outputted from the chip enable buffer 100, receives an externally applied low level first page address signal PA1 of FIG. 8B, and buffers and outputs the low level page address signal PA1.

The ATD signal generator 104 receives the address signal ADS outputted from the address buffer 101 and the page address signal outputted from the page address buffer 103 respectively, and detects the transition in the applied address and page address signals. And, due to the lack of transition in the address and page address signals applied to the ATD signal generator 104, the ATD signal generator 104 outputs a normal level ATD signal ATDS and a normal level page ATD signal PATDS respectively until an address signal 'B' of FIG. 8A and a page address signal PA2 of FIG. 8B are each applied thereto.

The first signal generator 105 receives the signals ATDS and PATDS respectively from the ATD signal generator 104, generates a sense amplifier control signal SACS in accordance with the applied ATDS signal and also generates, as shown in FIG. 8D, a high level buffer control signal BCS in accordance with the applied signals ATDS and PATDS.

The NOR gate NR in the second control signal generator 106 receives and NORs via its first to third input terminals the low level page address signal outputted from the buffers 31, 32 and 33, and outputs, as shown in FIG. 8C, a high level latch control signal RCS.

The page decoder 107 decodes and outputs therefrom a low level page address signal outputted from the page address buffer 103.

The predecoder 108 predecodes and outputs therefrom the address signal outputted from the address buffer 101.

The row decoder 110 and the column decodes 111 each decode a signal outputted from the predecoder 108, and in accordance with the decoded signals, the eight page data stored in the memory cell 109 are outputted therefrom in parallel.

The sense amplifier 112 amplifies and outputs therefrom the eight page data outputted from the memory cell 109 by the the row decodes 110 and the column decoder 111 after being enabled by the sense amplifier control signal SACS outputted from the first control signal generator 105.

The latch 113 stores temporarily and outputs therefrom the eight page data outputted from the sense amplifies 112 after being enabled by the high level latch control signal RCS outputted from the second control signal generator 106.

In more detail, when a low level latch central signal RCS id output by NOR gate NR of the second control signal generator 106, this low level signal is inverted into a high level signal by inverter I1 of latch 113 and is applied to the gate of PMOS transistor Q1 to be turned on, while the low level latch central signal RCS is also applied to the gate of NMOS transistor Q4 to cause transistor Q4 to be turned on.

The PMOS transistor Q2 and the NMOS transistor Q3 each perform a switching operation differently from each other, depending on the signal level of the data outputted from the sense amplifies 112 which is applied to the gate terminal of each of the MOS transistors. When a low level data signal is outputted from the sense amplifies 112, each of the PMOS transistor Q2 and the NMOS transistor Q3 receives at the respective gate terminals thereof the low level data signal outputted from the sense amplifies 112, and is turned on and off respectively, thus outputting therefrom a high level data signal. The outputted high level data is inverted to a low level data signal by the inverter I2 and is outputted therefrom.

When a high level data signal is outputted from the sense amplifies 112, the PMOS and NMOS transistors Q2, Q3 each receive at the respective gate terminal thereof the high level data signal outputted from the sense amplifier 112, and are turned off and on respectively to output therefrom a low level data signal. The outputted data signal is inverted to a high level data signal by the inverter I2 and is outputted therefrom.

The page decoder 114 decodes the signal outputted from the page pre-decoder 107 and selectively outputs a first page data out of the eight data outputted from the latch 113 in response to the decoded signal.

The output buffer 15 buffers and outputs therefrom the first page data outputted from the page decoder 114 in response to a high level buffer control signal BCS outputted from the first control signal generator 105. A more specific description follows with reference to FIG. 7.

First, the inverter IN1 in the output buffer 115 inverts the high level buffer control signal BCS outputted from the first control signal generator 105 and outputs a low level signal.

The inverter I2 receives a low or high level data signal outputted from the page decoder 114. When a low level data signal is applied thereto, the inverter IN2 inverts the low level data signal applied thereto and outputs a high level signal.

The NOR gate NOR receives at its one input terminal the low level signal outputted from the inverter IN1, and at its other input terminal the high level signal outputted from the inverter IN2 and NORs them and outputs a low level signal. The outputted low level signal is inverted to a high level signal by the inverter IN3.

The NAND gate ND receives at its input terminal the high level signal outputted from the inverter IN2, and at its other input terminal the high level buffer control signal BCS outputted from the first control signal generator 105, and NANDs and outputs a low level signal. The outputted low level signal is inverted to a high level signal by the inverter IN4 and is outputted therefrom.

The PMOS transistor PM1 receives at its gate terminal the high level signal outputted by the inverter IN3 and is turned off. The NMOS transistor NM1 receives at its gate terminal the high level signal outputted by the inverter IN4 and is turned on and outputs a low level signal data DT via the output line DT.

When a high level data signal is outputted by the page decoder 114, the output buffer 115 operates conversely to the above-described operation and outputs therefrom a high level data signal through output line DT. As a result, as shown in FIG. 8E, the output buffer 115 outputs the first page data D0.

An applied address signal 'B', as shown in FIG. 8A, is buffered by the address buffer 101 and outputted therefrom. When an applied second page address signal PA2, as shown in FIG. 8B, is buffered by the page address buffer 101 and outputted therefrom, the ATD signal generator 104 receives the address signal 'B' outputted from the address buffer 101 and accordingly detects the address transition thereof, and generates an ATD signal ATDS in accordance with the detection.

The ATD signal generator 104 receives the page address signal outputted from the page address buffer 103 and detects the address transition thereof, and generates an ATD signal PATDS in accordance with the detection.

The first control signal generator 105 receives the ATD signals ATDS, PATDS, respectively and generates a high level sense amplifier control signal SACS in accordance with the received signal ATDS and a low level buffer control signal BCS, as shown in FIG. 8D, in accordance with the applied signals ATDS, PATDS.

The NOR gate NR in the second control signal generator 106 receives the page address signal outputted from the buffers 31, 32 and 33 respectively, and outputs, as shown in FIG. 8C, a low level latch control signal RCS.

The page pre-decoder 107 pre-decodes the second page address signal PA2 outputted from the page address buffer 103.

The pre-decoder 108 predecodes the address signal 'B' outputted from the address buffer 101, and the pre-decoded signal is decoded by the row decoder 110 and the column decoder 111.

The eight data stored in the memory cell 109 are read out therefrom in parallel in response to the signals decoded by the row decoder 110 and the column decoder 111.

Because the sense amplifier 112 becomes disabled by the sense amplifier control signal SACS outputted from the first control signal generator 105, the eight data withdrawn by the low decoder 110 and the column decoder 111 becomes blocked.

Because the PMOS transistor Q1 and the NMOS transistor Q4 each receive at their respective gate terminals a high level and a low level signal, they are turned off accordingly, the latch 113 continues outputting the second to eighth page data irrespective of the data outputted from the sense amplifier 112 and applied to the respective gate terminals of the PMOS transistor Q2 and the NMOS transistor Q3.

The page decodes 114 decodes the signal outputted from the page pre-decoder 107 and outputs the second page data outputted from the inverter I2 in the latch 113.

The inverter IN1 in the output buffer 115 receives and inverts the low level buffer control signal BCS to a high level signal therefrom.

The NOR gate NOR receives at its one input terminal the high level signal outputted from the inverter IN1 and outputs a low level signal regardless of the signal outputted from the inverter IN2 and applied to its other input terminal. The outputted low level signal is inverted by the inverter IN3 to a high level signal.

The NAND gate ND receives at its one input terminal the low level buffer signal BCS outputted from the first control signal generator 105, and outputs a high level signal regardless of the signal outputted from the inverter IN2 and applied to its other input terminal. The outputted high level signal is inverted by the inverter IN4 to a low level signal.

The PMOS transistor PM1 and NMOS transistor NM1 receive at their respective gate terminals the high and low level signals outputted from the inverters IN3 and IN4, and are turned off respectively and, as shown in FIG. 8E, disabled during the time of the second page getting access to the output buffer 115, thus stopping data output.

The output buffer 115 receives the high level buffer control signal BCS outputted from the first control signal generator 105 and outputs a second page data according to the operation set forth previously.

When an applied third page address signal is buffered and outputted by the page address buffer 103, the ATD signal generator 104 receives the third page address signal, detects the transition thereof and outputs the address transition detection signal ATDS.

While the ATD signal generator 104 continues receiving the buffered address signal 'B', it outputs the ATD signal ATDS having a predetermined level.

The first control signal generator 105 receives signals ATDS, PATDS outputted from the ATD signal generator 104, generates the sense amplifier control signal SACS in response to the applied ATDS signal, and outputs a low and high level buffer control signals BCS according to the applied PATDS signal, as shown in FIG. 8D.

As shown in FIG. 8C, the second control signal generator 106 continues outputting a low level latch control signal RSC in accordance with the third page address signal outputted from the page address buffer 103.

The page pre-decoder 107 pre-decodes and outputs therefrom the third page address signal outputted from the page address buffer 103.

The sense amplifier 112 receives the sense amplifier control signal SACS outputted from the first control signal generator 105, becomes enabled accordingly and amplifies to a certain level and outputs the eight page data designated by the address signal 'B'.

The latch 113 receives the low level latch control signal RCS outputted from the second control signal generator 106, blocks the eight data being outputted from the sense amplifier 112 and goes on outputting the third to eighth page data in accordance with the address signal 'A'.

The page decoder 114 decodes the signal outputted from the page pre-decoder 107 and outputs therefrom the third page data.

The output buffer 115 as described previously receives high and low level buffer control signal BCS outputted from the first control signal generator 105. When the applied signal BCS is at a low level, the third page data outputted from the page decoder 114 becomes blocked, and when the signal BCS is in a high level, the third page data outputted from the page decoder 114 is outputted from the output buffer 115.

As shown in FIG. 8E, the output buffer 114 outputs the fourth to eighth data respectively in accordance with the fourth to eighth page address signals.

When the buffers 31, 32 and 33 of the page address buffer 103 buffer and output the externally applied first page address signal PB1 designated as a low level signal at the second page mode cycle, as shown in FIG. 8B, the NOR gate NR in the second control signal generator 106 receives same at its first to third terminals and NORs the resulting low level signals respectively and outputs a high level latch control signal RCS, as shown in FIG. 8C.

The first control signal generator 105 as described previously outputs a high and low signal.

The latch 113 designated by the address signal 'B' latches and outputs therefrom the eight page data outputted from the sense amplifier 112.

The page decoder 114 decodes a second page address signal PB1 pre-decoded and outputted from the page pre-decoder 107 and outputs the first page data applied thereto from the latch 113.

The output buffer 115 as described previously becomes disabled by the low level buffer control signal BCS outputted from the first control signal generator 105 and blocks the first page data outputted from the page decoder 114 until it becomes enabled by the high level buffer control signal outputted from the first control signal generator 105 and outputs therefrom the first page data applied thereto from the page decoder 114.

The page data access operation in accordance with the address signal 'C' as shown in FIG. 8A and the second to eighth page address signals PB2–PB8 is identical to operation in the previous description and specific description thereof will be omitted.

As described above, a high speed data access apparatus for a memory device in accordance with the present invention has advantages, in that during an initial operation only a first page data becomes accessed during a normal mode access time, by generating the latch control signal resulting from the page address signal so as to control the latch, and meanwhile the other page data becomes accessed during a page mode access time, thereby realizing a high speed access.

Additionally, since the output buffer control can be realized in a page mode as well as in a normal mode, noise which can occur during the output buffer operation can be prevented.

What is claimed is:

1. A high speed data access apparatus for memory, comprising:

an ATD signal generating means for detecting each transition of an address signal and a page address signal after being enabled by the chip enable signal and for generating each of an ATD signal and a page ATD signal;

a first control signal generating means for generating a sense amplify control signal using an ATD signal outputted from the ATD signal generating means after being enabled by an enable signal inputted thereto from the output enable buffer and generating a buffer control signal using an ATD signal and a page address transition signal respectively outputted from the ATD signal generator;

a second control signal generating means for generating a latch control signal using a page address signal outputted from the page address buffer;

a page predecoder for predecoding a page address signal outputted from the page address buffer;

a predecoder for decoding an address signal outputted from the address buffer;

a low decoder and a column decoder each for decoding a signal outputted from the predecoder, designating and withdrawing data stored previously in a memory cell and;

a sense amplifier, after being enabled by a sense amplify enable signal outputted from the first control signal generator, for amplifying to a certain level the page data applied thereto using the low decoder and the column decoder;

a latch for temporarily storing therein the data outputted from the sense amplifier after being enabled by a latch signal outputted from the second control signal generator;

a page decoder for decoding a signal outputted from the page predecoder and selectively outputting therefrom the page data outputted from the latch; and an output buffer for buffering the page data outputted from the page decoder after being enabled by a buffer control signal outputted from the first control signal generator and outputting the buffered page data therefrom.

2. The apparatus of claim 1, wherein the second control signal generating means includes a NOR gate for NORring page address signals outputted from the page address buffers, and outputting a latch control signal therefrom.

3. The apparatus of claim 1, wherein the latch comprises a first PMOS in which the source terminal thereof is connected to a voltage terminal and the gate thereof is connected to the output terminal of a first inverter, a second PMOS transistor in which the source terminal is connected to the drain terminal of the first PMOS transistor and the gate thereof is connected to the output line of the sense amplifier, a first NMOS transistor in which the drain terminal thereof is connected to that of the second PMOS transistor and to the input terminal of an inverter, respectively and its gate is connected to that of the second PMOS transistor, a second NMOS transistor in which the drain terminal thereof is connected to the source terminal of the first NMOS transistor, the gate thereof is connected to the input terminal of the first inverter and the source terminal thereof is connected to the ground terminal thereof, and a third inverter in which the input terminal thereof is connected to the output terminal of the second inverter and the output terminal thereof is connected to the input terminal of the second inverter.

4. The apparatus of claim 1, wherein the output buffer comprises a first inverter which input terminal is connected to a line of a buffer control signal outputted from the first control signal generator, a second inverter which input terminal is connected to an output line from the page decoder, a NOR gate wherein one end of the input terminal thereof is connected to the output line of the first inverter and the other end thereof is connected to the output line of the second inverter, a NAND gate wherein one end of the input terminal thereof is connected to the other end of the NOR gate and the other end thereof is connected to the input terminal of the first inverter, a third inverter which input terminal is connected to the output terminal of the NOR gate, a fourth inverter which input terminal is connected to the output terminal of the NAND gate, a PMOS transistor wherein the source terminal thereof is connected to the voltage terminal and the drain terminal thereof is connected to the output terminal of the third inverter, and an NMOS transistor wherein the drain terminal thereof is connected to that of the PMOS transistor, the gate thereof is connected to the output terminal of the inverter and the source terminal thereof is connected to the ground terminal.

* * * * *